(12) United States Patent
Chien et al.

(10) Patent No.: US 8,067,815 B2
(45) Date of Patent: Nov. 29, 2011

(54) ALUMINUM COPPER OXIDE BASED MEMORY DEVICES AND METHODS FOR MANUFACTURE

(75) Inventors: Wei-Chih Chien, Taipei (TW); Kuo-Pin Chang, Yuanli Township (TW); Yi-Chou Chen, Hsinchu (TW); Erh-Kun Lai, Elmsford, NY (US); Kuang-Yeu Hsieh, Hsinchu (TW)

(73) Assignee: Macronix International Co., Lt.d., Hsinchu (TW)

( * ) Notice: Subject to any disclaimer, the term of this patent is extended or adjusted under 35 U.S.C. 154(b) by 3 days.

(21) Appl. No.: 12/332,837

(22) Filed: Dec. 11, 2008

(65) Prior Publication Data

US 2010/0148142 A1    Jun. 17, 2010

(51) Int. Cl.
*H01L 29/72* (2006.01)
(52) U.S. Cl. ......... 257/530; 257/529; 438/381; 365/148
(58) Field of Classification Search .......... 257/529, 257/530; 438/381; 365/148
See application file for complete search history.

(56) References Cited

U.S. PATENT DOCUMENTS

| 6,620,670 | B2 | 9/2003 | Song et al. |
| 7,053,406 | B1 | 5/2006 | Ho et al. |
| 7,285,464 | B2 | 10/2007 | Herner et al. |
| 2004/0071879 | A1 | 4/2004 | Callegari et al. |
| 2005/0073010 | A1 | 4/2005 | Lai et al. |
| 2009/0026433 | A1* | 1/2009 | Chiang .......................... 257/2 |
| 2009/0168492 | A1* | 7/2009 | Thorp et al. .................. 365/148 |
| 2009/0196822 | A1* | 8/2009 | Garg et al. ..................... 423/654 |
| 2009/0261343 | A1* | 10/2009 | Herner et al. .................. 257/74 |

FOREIGN PATENT DOCUMENTS

| TW | 583764 | 11/2004 |
| TW | 258840 | 7/2006 |

OTHER PUBLICATIONS

Herner, S.B., et al., "Vertical p-i-n Polysilicon Diode with Antifuse for Stackable Field-Programmable ROM," IEEE IEDM, vol. 25, No. 5, May 2004, 271-273.

* cited by examiner

*Primary Examiner* — Edward Wojciechowicz
(74) *Attorney, Agent, or Firm* — Haynes Beffel & Wolfeld LLP

(57) ABSTRACT

Memory devices are described along with methods for manufacturing. A memory device as described herein includes a first electrode and a second electrode. The memory device further includes a diode and an anti-fuse metal-oxide memory element comprising aluminum oxide and copper oxide. The diode and the metal-oxide memory element are arranged in electrical series between the first electrode and the second electrode.

21 Claims, 13 Drawing Sheets

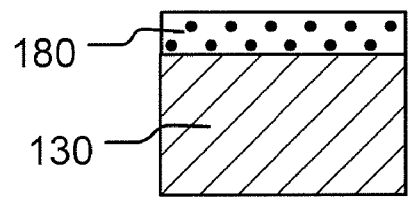
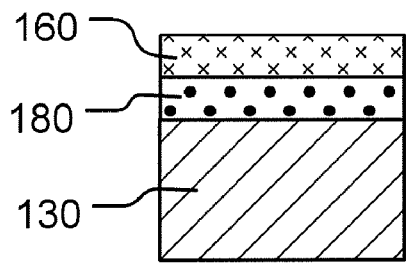
FIG. 6A     FIG. 6B
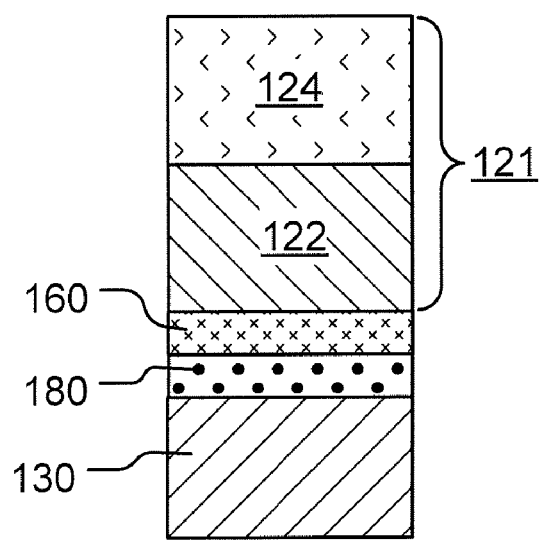
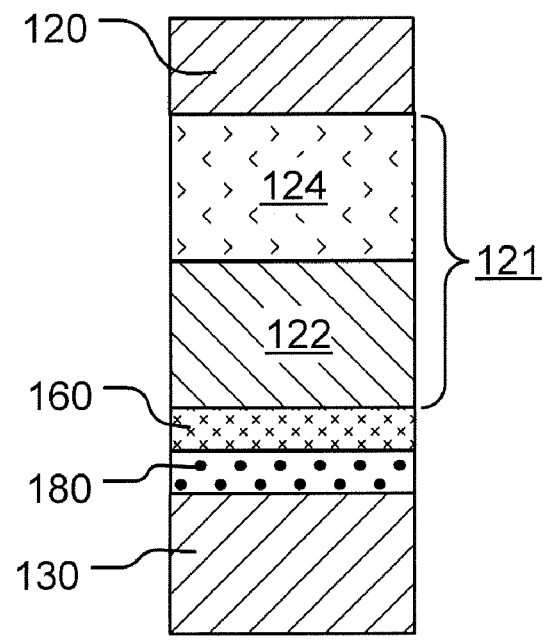
FIG. 6C     FIG. 6D

ALUMINUM COPPER OXIDE BASED MEMORY DEVICES AND METHODS FOR MANUFACTURE

BACKGROUND OF THE INVENTION

1. Field of the Invention

The present invention relates to metal-oxide based memory devices.

2. Description of Related Art

One-time programmable (OTP) memory is used in integrated circuits for a variety of nonvolatile memory applications. OTP memory is typically implemented using charge storage, fuse, or anti-fuse techniques.

Anti-fuse type memory is programmed by applying a voltage pulse across a dielectric or other high resistance material to induce breakdown and form a low resistance current path through the material. Various materials including silicon oxide, silicon nitride, silicon-oxynitride, aluminum oxide, and hafnium oxide have been proposed for use in anti-fuse type memory. Typically programming voltages of 10 V or more are needed, which increases the complexity of circuitry for memory devices employing these types of materials. In addition, the breakdown process can take a relatively long time (for example greater than 1 microsecond) and require a large current, resulting in relatively slow programming speeds and high power consumption.

It is therefore desirable to provide high density anti-fuse type memory devices having relatively low programming voltages and fast programming times.

SUMMARY OF THE INVENTION

A memory device as described herein includes a first electrode and a second electrode. The memory device further includes a diode and an anti-fuse metal-oxide memory element comprising aluminum oxide and copper oxide. The diode and the metal-oxide memory element are arranged in electrical series between the first electrode and the second electrode. In some embodiments metal material of the metal-oxide memory element is 0.5 to 2.0 at % copper.

A method for manufacturing a memory device as described herein includes forming a first electrode, forming a diode, and forming an anti-fuse metal-oxide memory element comprising aluminum oxide and copper oxide. The method further comprises forming a second electrode, the diode and the metal-oxide memory element arranged in electrical series between the first electrode and the second electrode.

Advantageously, anti-fuse metal-oxide memory elements comprising aluminum oxide and copper oxide as described herein are shown to have a relatively low programming voltage (for example 6 Volts) and a fast programming time (for example 30 nsec). As a result, the power consumption during programming of the memory elements described herein is reduced compared to other types of anti-fuse based memory. Additionally, the memory elements described herein are shown to have a large resistance ratio between the high and low resistance states and exhibit very good data retention in both states.

Memory arrays having memory cells as described herein result in high density memory. In embodiments the cross-sectional area of the memory cells of the array can be determined entirely by dimensions of the word lines and bit lines, allowing for a high memory density for the array. The word lines have word line widths and adjacent word lines are separated by a word line separation distance, and the bit lines have bit line widths and adjacent bit lines are separated by a bit line separation distance. In some embodiments the sum of the word line width and the word line separation distance is equal to twice a feature size F used to form the array, and the sum of the bit line width and the bit line separation distance is equal to twice the feature size F. Additionally, F can be a minimum feature size for a process (typically a lithographic process) used to form the bit lines and word lines, such that memory cells of the array have a memory cell area of $4F^2$.

Other aspects and advantages of the present invention can be seen on review of the drawings, the detailed description, and the claims which follow.

BRIEF DESCRIPTION OF THE DRAWINGS

FIGS. 6A-6D illustrate steps in a manufacturing process for manufacturing the memory cell of FIG. 5A.

DETAILED DESCRIPTION

Figure 1A:
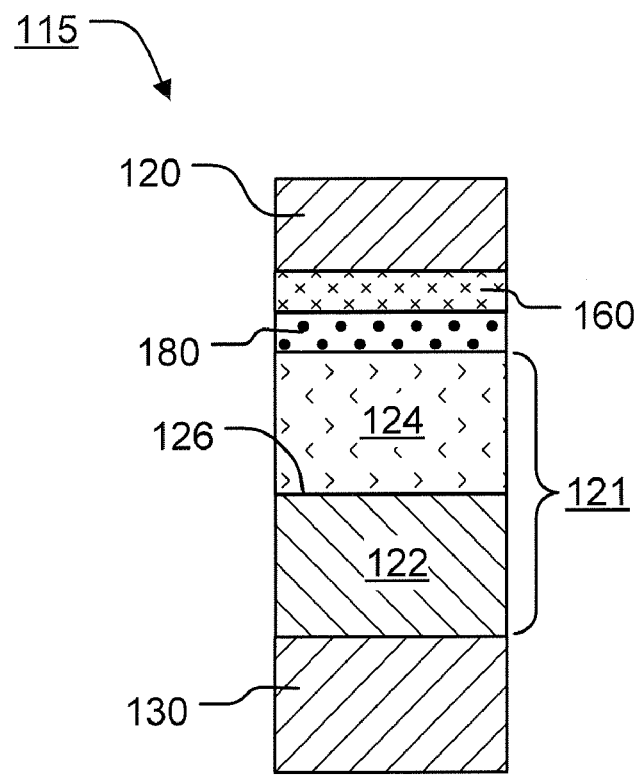
FIG. 1A illustrates a cross-sectional view of a first embodiment of a memory cell including an anti-fuse metal-oxide memory element comprising aluminum and copper.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

Figure 1B:
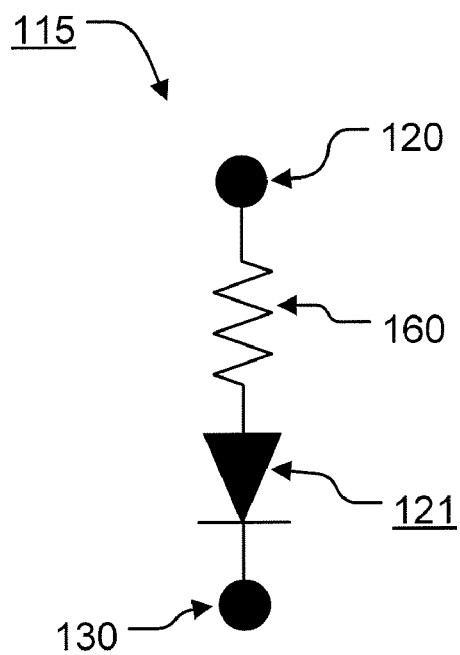
FIG. 1B illustrates a schematic diagram of the memory cell of FIG. 1A.

FIG. 1A illustrates a cross-sectional view of a first embodiment of a memory cell 115 including an anti-fuse metal-oxide memory element 160 comprising aluminum and copper. The memory cell 115 includes a diode 121 arranged in electrical series with the memory element 160 along a current path between a first electrode 130 and a second electrode 120. FIG. 1B illustrates a schematic diagram of the memory cell 115 of FIG. 1A.

The first and second electrodes 130, 120 are conductive elements respectively. The first and second electrodes 130, 120 may each comprise, for example, one or more elements selected from the group consisting of Ti, W, Mo, Al, Ta, Cu, Pt, It, La, Ni, N, O, and Ru and combinations thereof, and in some embodiments may comprise more than one layer. In some embodiments the first electrode 130 may comprise a portion of a word line, and the second electrode 120 may comprise a portion of a bit line.

The memory cell 115 includes a conductive element 180 between the memory element 160 and the diode 121. In the illustrated embodiment the conductive element 180 comprises TiN. Alternatively, other materials can be used. The conductive element 180 is a buffer layer used to improve adhesion between the memory element 160 and the diode 121.

The diode 121 includes a first node 122 on the first electrode 130 and a second node 124 on the first node 122 to define a junction 126 therebetween. The diode 121 can be a pn diode or a Schottky diode. In embodiments in which the diode 121 is a pn diode, the first node 122 is a doped semiconductor material having a first conductivity type (N-type in this example), and the second node 124 is a doped semiconductor material having a second conductivity type (P-type in this example) opposite the first conductivity type.

In embodiments in which the diode 121 is Schottky diode, the first node 122 is a doped semiconductor material having a first conductivity type (N-type in this example), and the second node 124 is a metal.

In the illustrated embodiment the metal-oxide memory element 160 is an aluminum-copper-oxide ($Al_xCu_yO_z$). In embodiments the metal material of the memory element 160 can, for example, be between 0.5 to 2.0 at % copper. In some additional embodiments the metal-oxide memory element 160 further includes additional materials such as one or more of tungsten oxide, nickel oxide, cobalt oxide, and magnesium oxide.

Reading or writing to memory cell 115 can be achieved by applying appropriate voltage pulses to one or both of the first and second electrodes 130, 120 to forward-bias the diode 121 and induce a current through the memory element 160. The levels and durations of the voltages applied is dependent upon the operation performed, e.g. a reading operation or a programming operation. The levels and durations of the voltage pulses can be determined empirically for each embodiment.

In a read (or sense) operation of a data value stored in the memory cell 115, bias circuitry coupled to the first and second electrodes 130, 120 applies a read voltage pulse across the memory cell 115 of suitable amplitude and duration to induce current to flow which is insufficient to cause breakdown of the anti-fuse memory element 160. The bias circuitry can be, for example, the biasing arrangement supply voltages, current sources 36 as discussed below with reference to FIG. 7. The current through the memory cell 115 is dependent upon the resistance of the anti-fuse memory element 160 and thus the data value stored in the memory cell 115. The data value may be determined, for example, by comparison of the current through the memory cell 115 with a suitable reference current by sense amplifiers (See, for example, sense amplifiers/data-in structures 24 of FIG. 7).

In a program operation of a data value to be stored in the memory cell 115, bias circuitry coupled to the first and second electrodes 130, 120 applies a program voltage pulse across the memory cell 115 of suitable amplitude and duration to induce current to flow and cause a breakdown of the anti-fuse memory element 160 to form a low resistance current path (or current paths) through the memory element 160. The bias circuitry can be, for example, the biasing arrangement supply voltages, current sources 36 as discussed below with reference to FIG. 7. In some embodiments the program operation may include more than one pulse.

FIGS. 2A-2D illustrate steps in a manufacturing process for manufacturing the memory cell 115 of FIG. 1A.

Figure 2A:
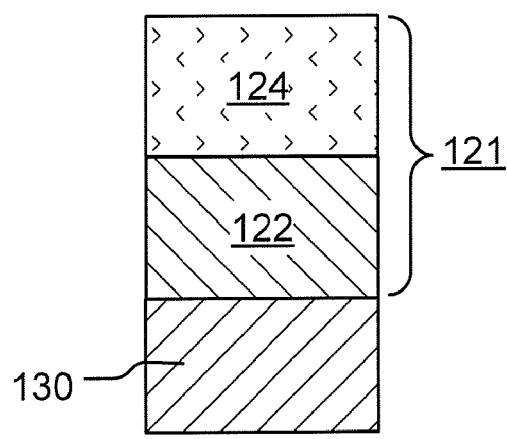
FIGS. 2A-2D illustrate steps in a manufacturing process for manufacturing the memory cell of FIG. 1A.

FIG. 2A illustrates a first step of forming the diode 121 on the first electrode 130. In embodiments in which the diode 121 is a pn junction diode, the diode 121 can be formed by forming a layer of semiconductor material on the material of the first electrode 130 and performing implantation and activation processes. In embodiments in which the diode is a Schottky diode, the diode 121 can be formed by first forming doped semiconductor material for the first node 122 and then depositing metal material for the second node 124.

Figure 2B:
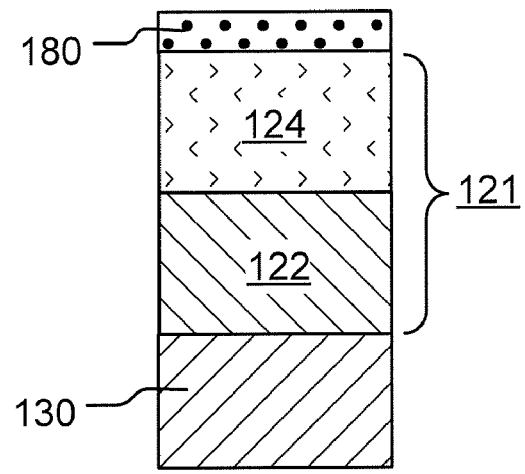

Next, the conductive element 180 is formed on the diode 121 of FIG. 2A, resulting in the structure illustrated in the cross-sectional view of FIG. 2B. In the illustrated embodiment the conductive element 180 comprises TiN and can be formed, for example, by chemical vapor deposition (CVD).

Figure 2C:
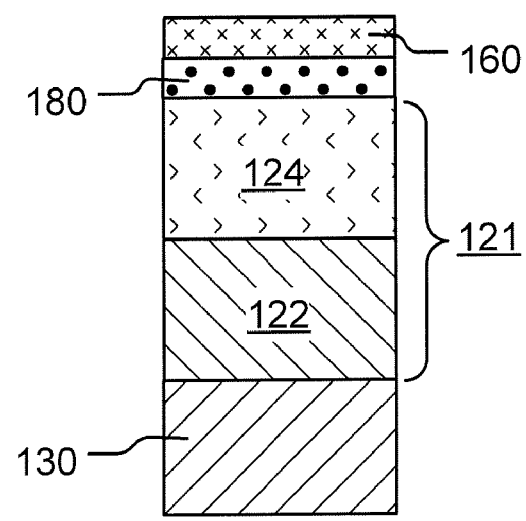
Figure 2D:
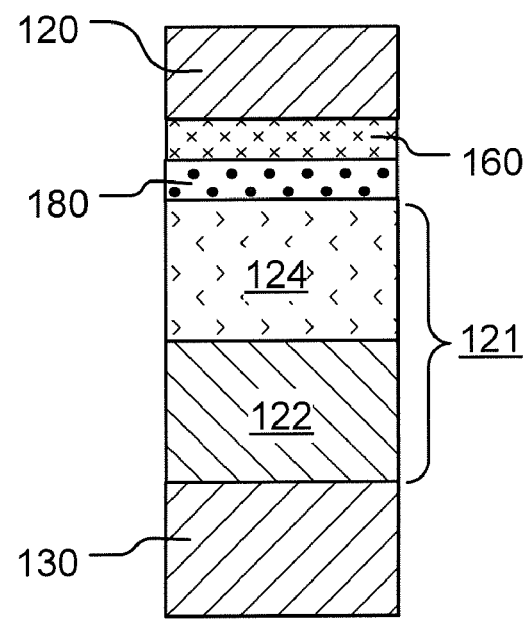

Next, the metal-oxide memory element 160 comprising aluminum oxide and copper oxide is formed on the conductive element 180 of FIG. 2A, resulting in the structure illustrated in the cross-sectional view of FIG. 2C. The metal-oxide memory element 160 can be formed by various deposition and oxidation techniques. The memory element 160 can be formed by first depositing a metal layer comprising aluminum and copper (for example having between 0.5 to 2.0 at % copper), followed by a subsequent oxidation process to oxidize the layer and form the memory element 160. Alternatively, the memory element 160 can be formed by a single process which deposits the memory element 160 as an oxide.

Exemplary deposition methods include atomic layer deposition and thermal evaporation using a mixed metal target of aluminum and copper.

Exemplary oxidation methods include oxidation by a high temperature oxidation, such as furnace oxidation. Another oxidation method is plasma oxidation such as down-stream plasma oxidation. In one embodiment, a sputtering process is used to deposit the copper and aluminum material and down-stream plasma is applied with a pressure of 3000 mtorr, a power of about 1250 W, an $O_2/N_2$ flow of about 4000 sccm/200 sccm, a temperature of about 150° C., and a time duration of 50 seconds. Increasing the time duration of the down-stream plasma process increases the thickness of the metal-oxide memory element 160.

Figure 3A:
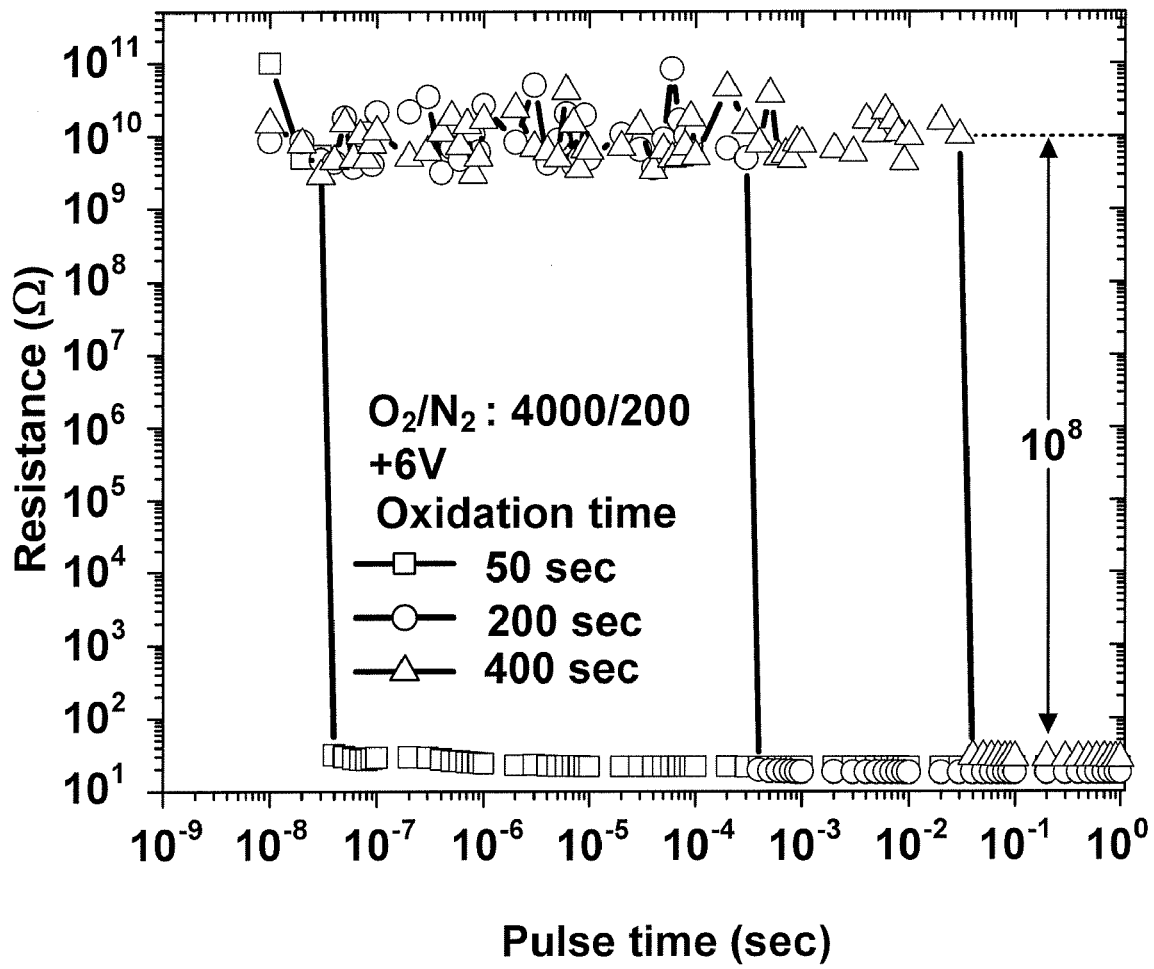
FIGS. 3A and 3B are measured data showing the dependence of the programming speed on the time duration of a down-stream plasma process used to form the memory element.
Figure 3B:
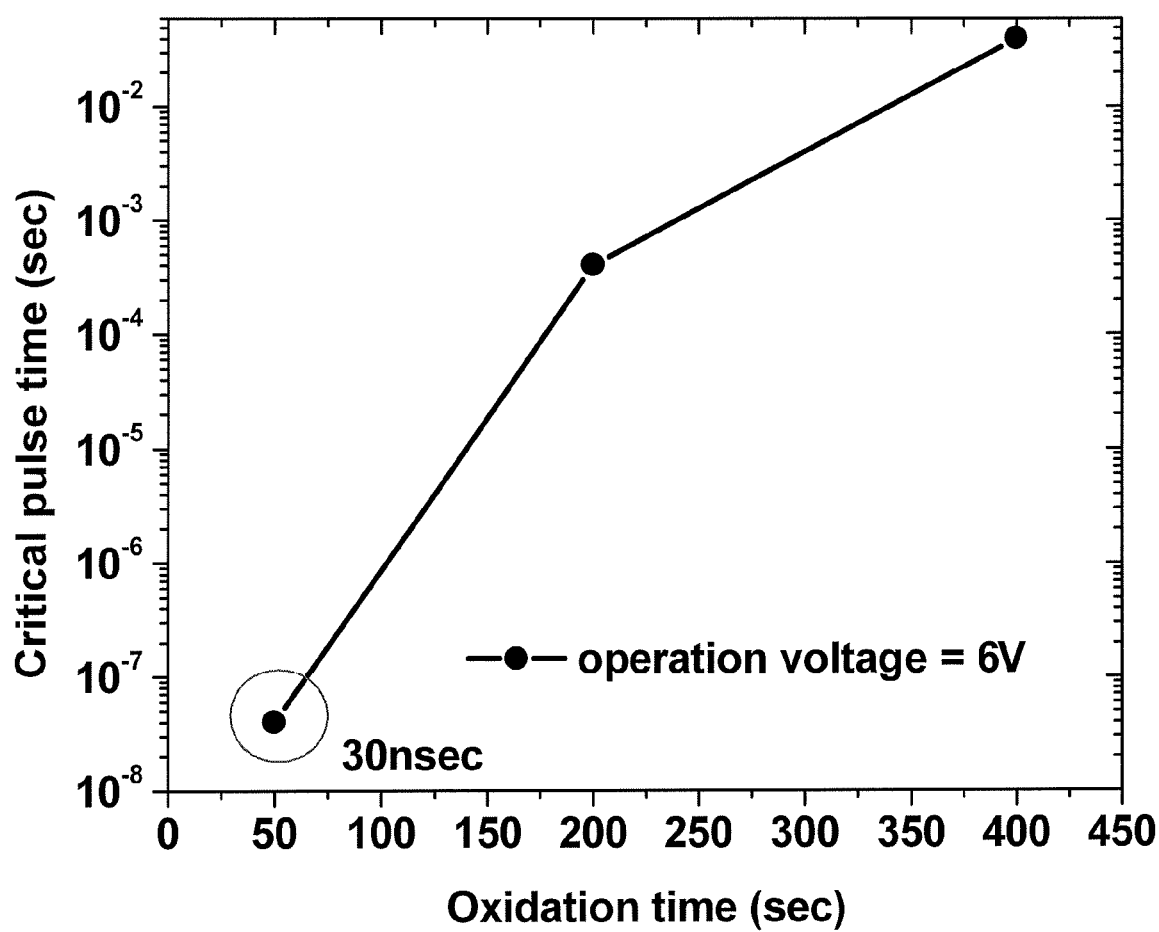

FIGS. 3A and 3B are measured data showing the dependence of the programming speed on the time duration of a down-stream plasma process used to oxidize the memory element 160. In the data of FIGS. 3A and 3B memory elements 160 were 2 at % copper and were oxidized using time durations of 50 sec, 200 sec, and 400 sec.

FIG. 3A is a plot of the measured resistance of the memory elements 160 versus pulse time for a 6V programming pulse applied across the memory elements 160. The memory elements 160 have an initially high resistance. Once a "critical pulse time" is reached, breakdown occurs and a low resistance current path (or current paths) is formed through the memory element 160 which significantly reduces the resistance. As can be seen in FIG. 3A, the critical pulse time decreases considerably as the time duration of the down-stream plasma process was reduced. FIG. 3B summarizes the critical pulse time versus the time duration ("Oxidation time") for the data of FIG. 3A.

As can be seen in the measured data, the memory elements 160 comprising aluminum oxide and copper oxide as described herein have a relatively low programming voltage (6 Volts in the results of FIGS. 3A and 3B) and a fast programming time (30 nsec in the measured results of FIGS. 3A and 3B).

Figure 4:
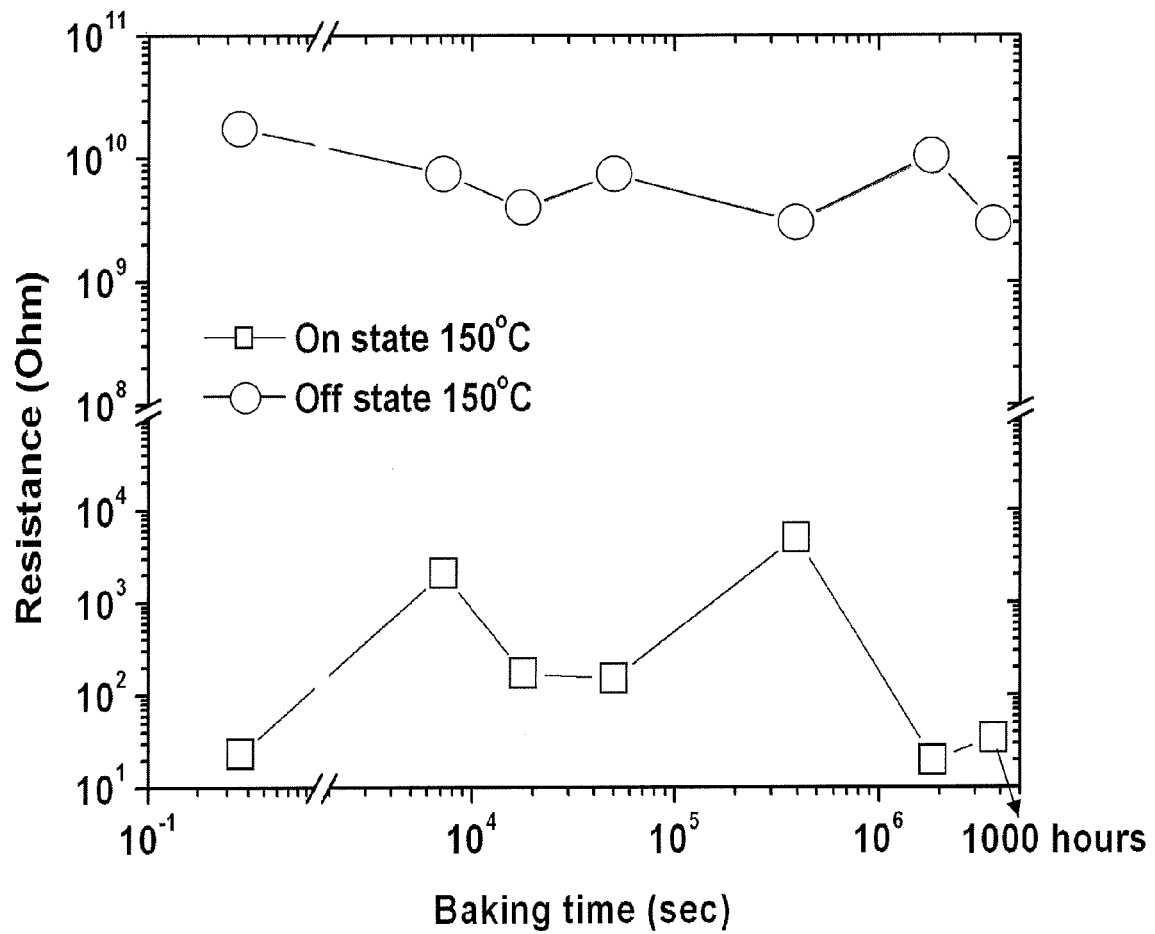
FIG. 4 is the measured resistance of the memory element versus time in the high resistance state and the low resistance state at a temperature of 150° C.

FIG. 4 is the measured resistance using a read voltage of 0.25V of the memory element 160 versus time in the high resistance state ("Off state") and the low resistance state ("On state") at a temperature of 150° C. The memory element 160 of the data of FIG. 4 was oxidized using down-stream plasma with a time duration of 50 seconds. As can be seen in FIG. 4, the memory element 160 exhibits very good data retention in both states.

Figure 5A:
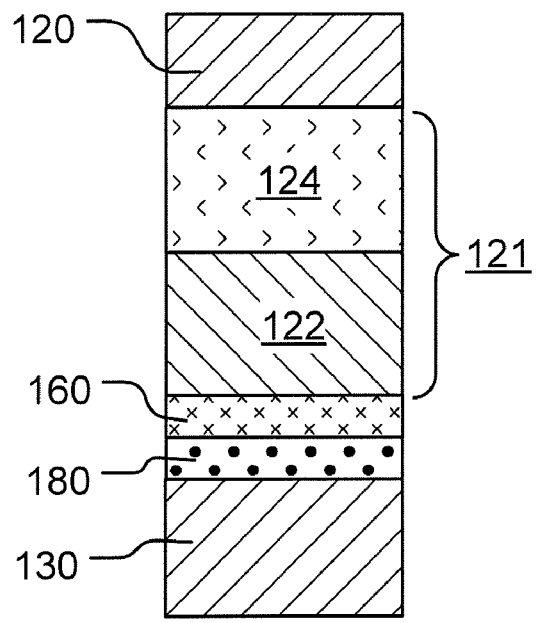
FIG. 5A illustrates a cross-sectional view of a second embodiment of a memory cell with the diode overlying the memory element.
Figure 5B:
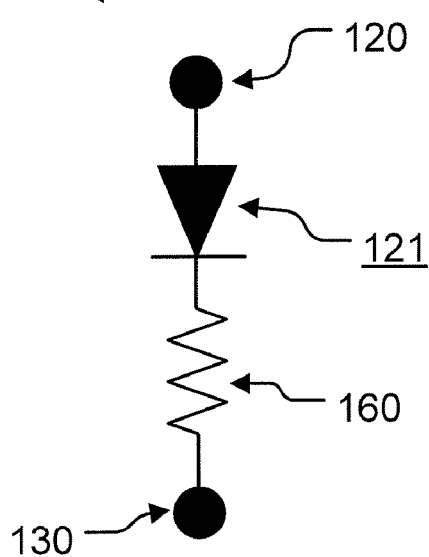
FIG. 5B illustrates a schematic diagram of the memory cell of FIG. 5A.

In the illustrated embodiment of FIG. 1A the memory element 160 overlies the diode 121. FIG. 5A illustrates a cross-sectional view of a second embodiment for the memory cell 115 with the diode 121 overlying the memory element 160. FIG. 5B illustrates a schematic diagram of the memory cell 115 of FIG. 5A. The same reference numbers for the various elements are used in FIGS. 5A-5B as in FIGS. 1A-1B.

FIGS. 6A-6D illustrate steps in a manufacturing process for manufacturing the memory cell 115 of FIG. 5A. The materials and processes discussed above with respect to FIGS. 1A-1B and 2A-2D can be used in the various steps of FIGS. 6A-6D, and thus a detailed description is not repeated here.

FIG. 6A illustrates a first step of forming the conductive element 180 on the bottom electrode 130. Next, the memory element 160 is formed on the conductive element 180, resulting in the structure illustrated in the cross-sectional view of FIG. 6B. The diode 121 is then formed on the memory element 160, resulting in the structure illustrated in the cross-sectional view of FIG. 6C. Due to the relatively high melting temperature of the memory element 160, the memory element 160 can endure high temperature treatment used in the formation of the diode 121. The top electrode 120 is then formed on the diode 121, resulting in the structure illustrated in the cross-sectional view of FIG. 6D.

Figure 7:
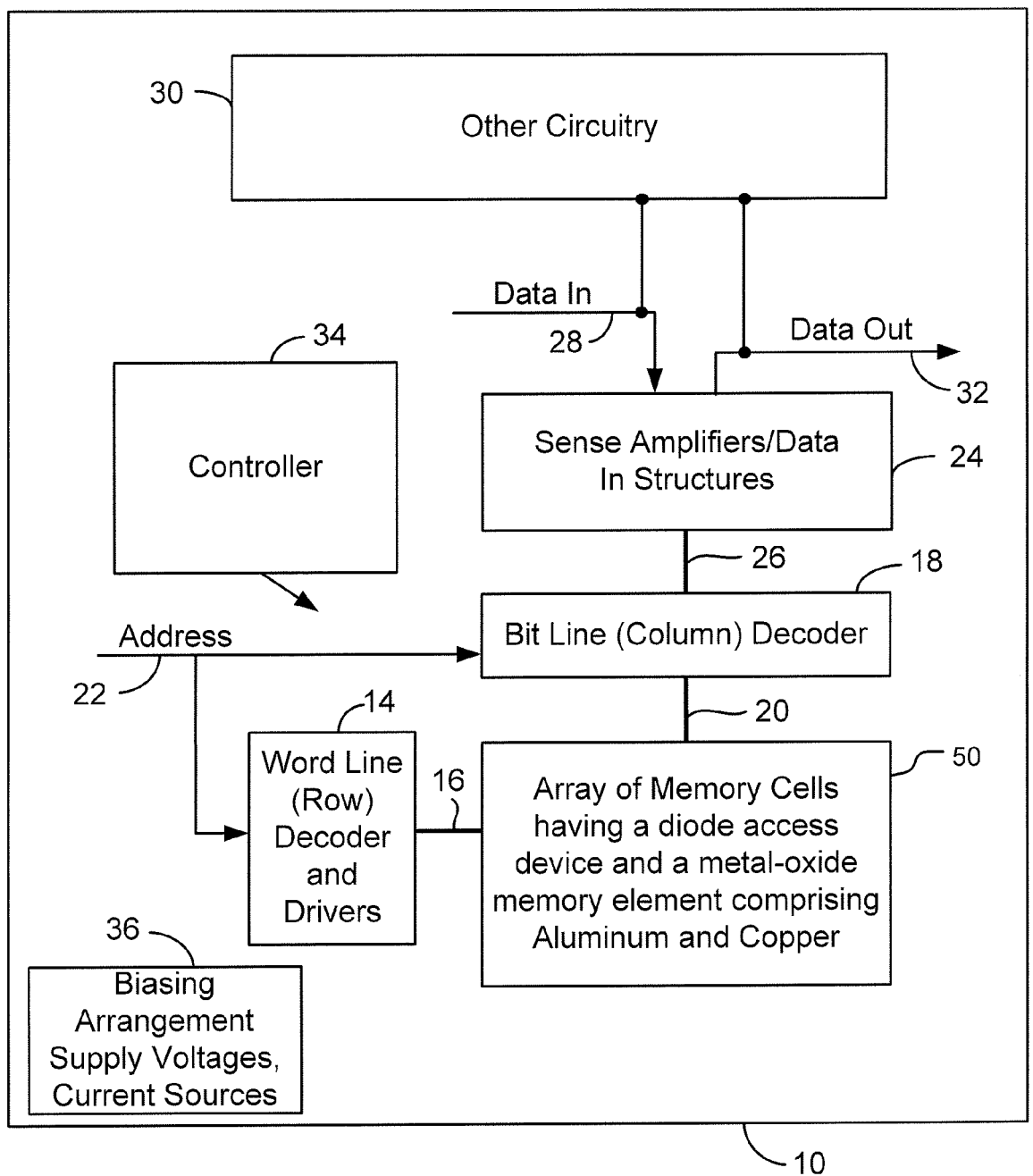
FIG. 7 is a simplified block diagram of an integrated circuit including an array of memory cells having memory elements as described herein.

FIG. 7 is a simplified block diagram of an integrated circuit 10 including a memory array 50 of memory cells having a diode access device and a metal-oxide memory element comprising aluminum oxide and copper oxide as described herein. A word line decoder 14 is coupled to and in electrical communication with a plurality of word lines 16. A bit line (column) decoder 18 is in electrical communication with a plurality of bit lines 20 to read data from, and write data to, the memory cells (not shown) in array 50. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 50. Data is supplied via a data-out line 32 from the sense amplifiers in block 24 to input/output ports on integrated circuit 10, or to other data destinations internal or external to integrated circuit 10.

A controller 34 implemented in this example, using a bias arrangement state machine, controls the application of bias arrangement supply voltages and current sources 36, for read and program modes of the memory cells of the array 50. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34

Figure 8:
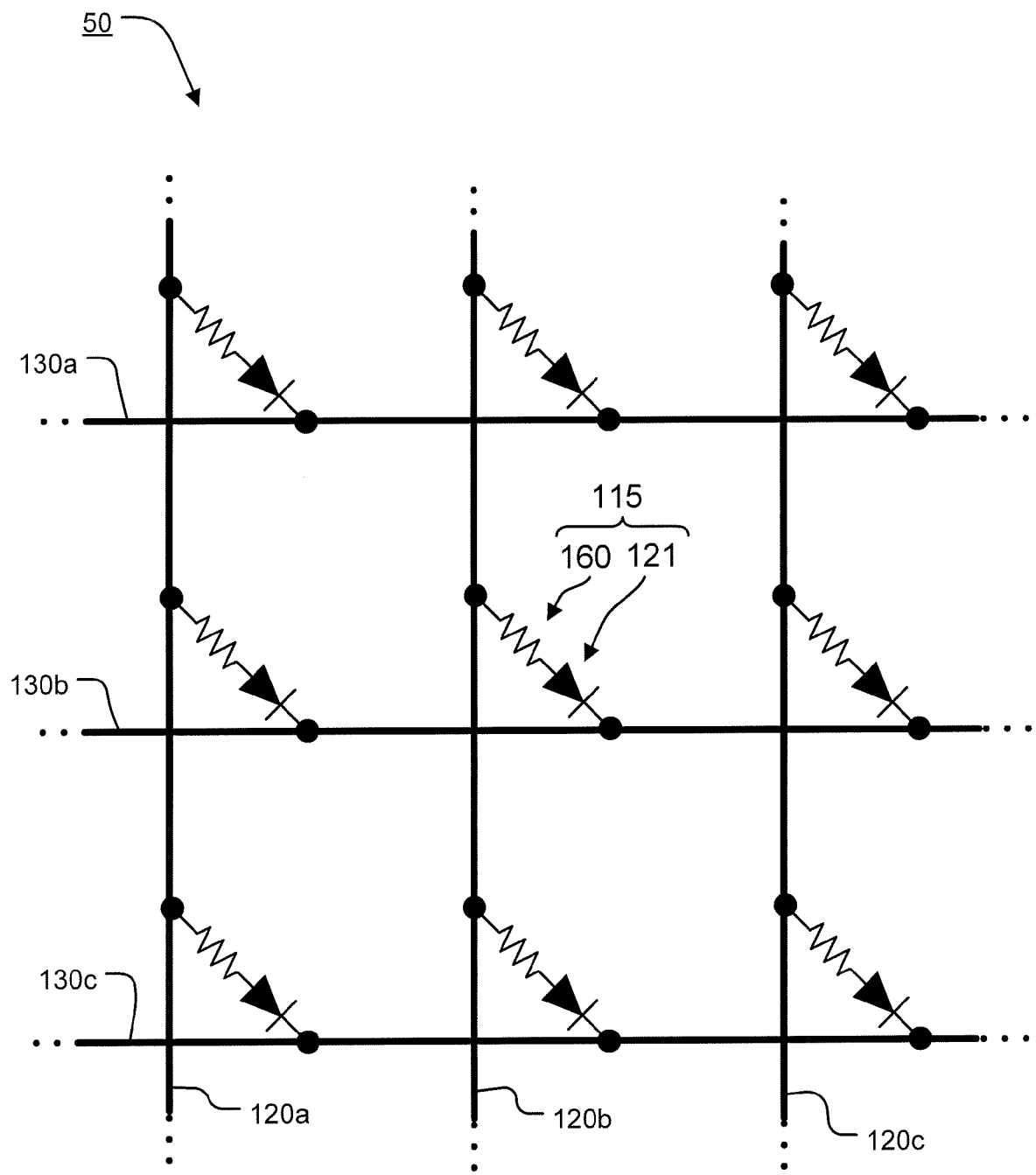
FIG. 8 illustrates a schematic diagram of a portion of the array of the integrated circuit of FIG. 7.

FIG. 8 illustrates a schematic diagram of a portion of the array 50 of the integrated circuit 10 of FIG. 7.

As shown in the schematic diagram of FIG. 8, each of the memory cells of the array 50 includes a diode access device and a metal-oxide memory element comprising aluminum and copper (each represented in FIG. 8 by a resistor) arranged in series along a current path between a corresponding word line 130 and a corresponding bit line 120.

The array comprises a plurality of word lines 130 including word lines 130a, 130b, and 130c extending in parallel in a first direction, and a plurality of bit lines 120 including bit lines 120a, 120b, and 120c extending in parallel in a second direction perpendicular to the first direction. The array 50 is referred to as a cross-point array because the word lines 130 and bit lines 120 cross each other but do not physically intersect, and the memory cells are located at these cross-point locations of the word lines 130 and bit lines 120.

Memory cell 115 is representative of the memory cells of array 50 and is arranged at the cross-point location of the word line 130b and the bit line 120b, the memory cell 115 comprising a diode 121 and a memory element 160 arranged in series. In the embodiment of FIG. 8 the diode 121 is electrically coupled to the word line 130b and the memory element 140 is electrically coupled to the bit line 120b.

Reading or writing to memory cell 115 of array 50 can be achieved by applying appropriate voltage pulses as discussed above to the corresponding word line 130b and bit line 120b to induce a current through the selected memory cell 115. The level and duration of the voltages applied is dependent upon the operation performed, e.g. a reading operation or a programming operation.

Figure 9A:
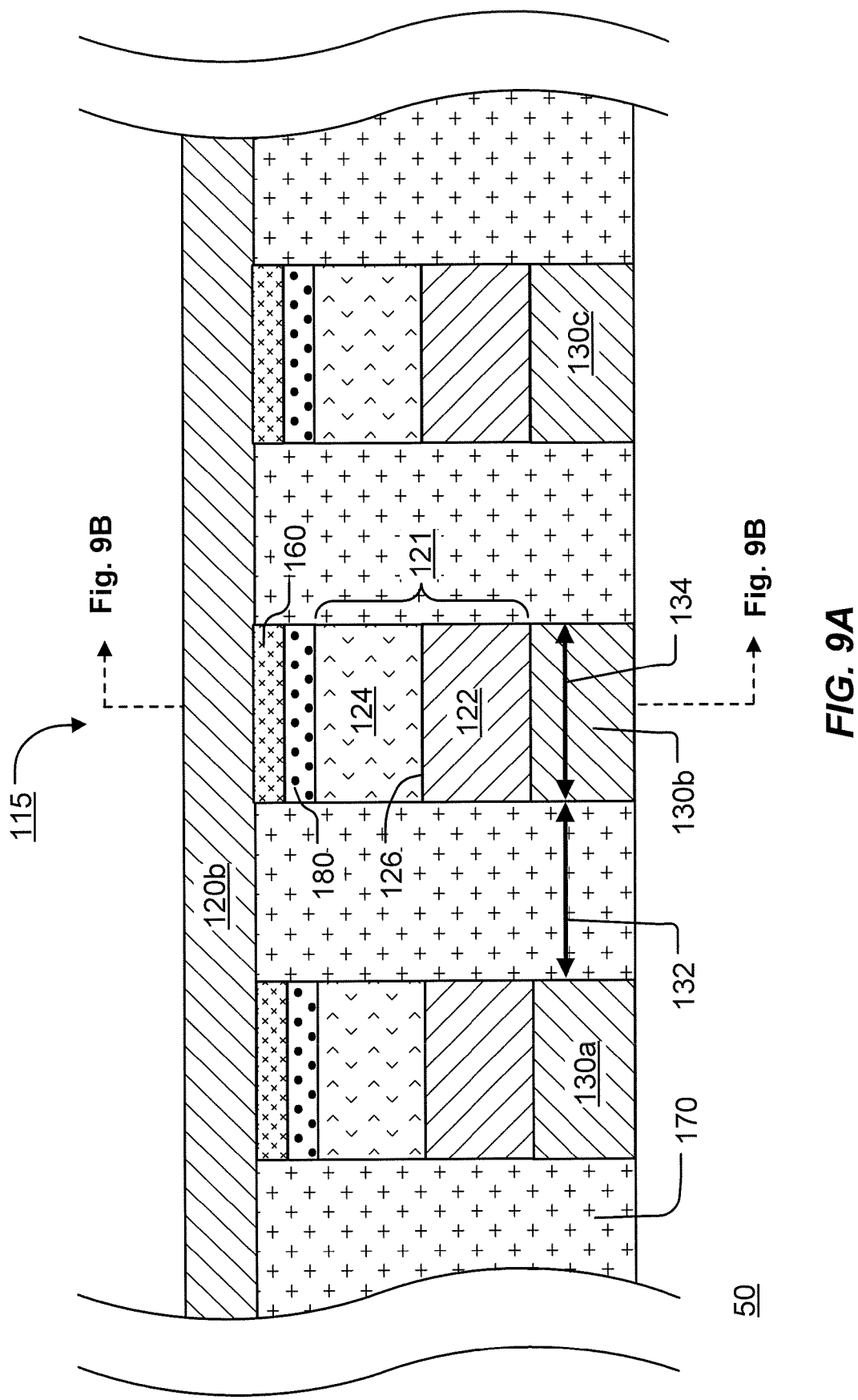
FIGS. 9A-9B illustrate cross-sectional views of a portion of a first embodiment of memory cells arranged in the array of FIG. 8.
Figure 9B:
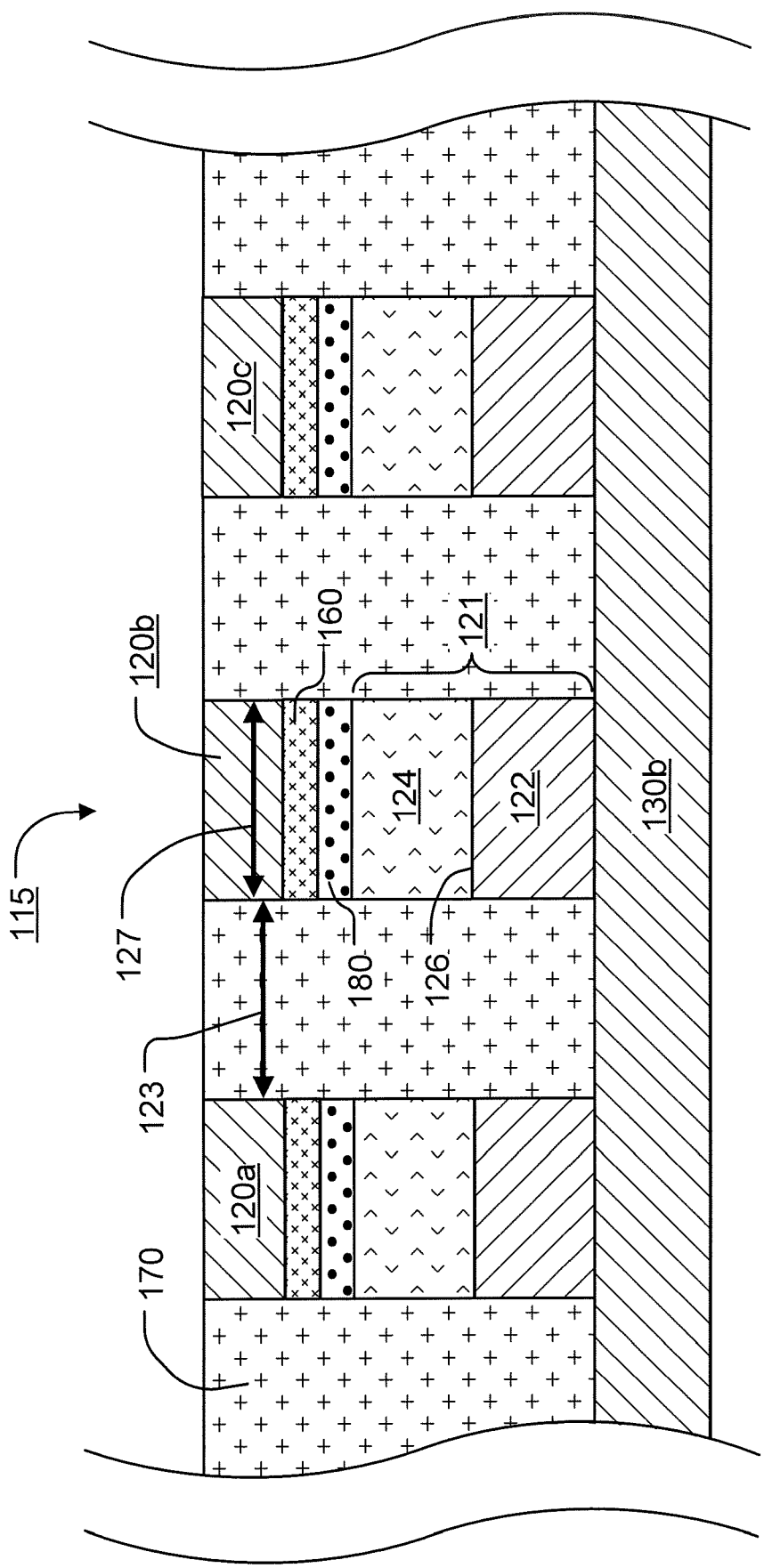

FIGS. 9A and 9B illustrate cross-sectional views of a portion of an embodiment of memory cells (including representative memory cell 115) arranged in the cross-point array 50, FIG. 9A taken along the bit lines 120 and FIG. 9B taken along the word lines 130.

Referring to FIGS. 9A and 9B, the memory cell 115 includes the diode 121 having first and second nodes 122, 124. The first node 122 of the diode 121 is on the corresponding word line 130b. The word line 130b, acting as the bottom electrode for the memory cell 115, may comprise any of the materials discussed above with respect to the bottom electrode 130 of FIG. 1A. Alternatively, the word lines 130 may comprise doped semiconductor material.

Conductive element 180 is on the second node 124 of the diode 121, and comprises TiN in the illustrated embodiment. The anti-fuse metal-oxide memory element 160 comprising aluminum and copper is on the conductive element.

The bit lines 120, including bit line 120b acting as a top electrode for the memory cell 115, are electrically coupled to the memory elements 160 and extend into and out of the cross-section illustrated in FIG. 5B. The bit lines 120 comprise one or more layers of conductive material. For example, the bit lines 120 may comprise Ti, W, Mo, Al, Ta, Cu, Pt, Ir, La, Ni, N, O, and Ru and combinations thereof.

Dielectric 170 separates adjacent memory cells, adjacent bit lines 120, and adjacent word lines 130. In the illustrated embodiment the dielectric 170 comprises silicon oxide. Alternatively, other dielectric materials may be used.

In operation, bias circuitry (See, for example, biasing arrangement supply voltages, current sources 36 of FIG. 7) coupled to the corresponding word line 110b and bit line 120b to apply bias arrangements across the memory cell 115 can induce a change in the resistance of the memory elements 160, the electrical resistance of the memory element 160 indicating the data value stored in the memory cell 115.

As can be seen in the cross-sections illustrated in FIGS. 9A and 9B, the memory cells of the array 50 are arranged at the cross-point locations of the word lines 130 and bit lines 120. Memory cell 115 is representative and is arranged at the cross-point location of word line 130b and bit line 120b. Additionally, the memory elements 160 and diodes 121 have a first width substantially the same as the width 134 of the word lines 130 (See FIG. 9A). Furthermore, the memory elements 160 and diode 121 have a second width substantially the same as the width 127 of the bit lines 120 (See FIG. 9B). As used herein, the term "substantially" is intended to accommodate manufacturing tolerances. Therefore, the cross-sectional area of the memory cells of array 50 is determined entirely by dimensions of the word lines 130 and bit lines 120, allowing for a high memory density for array 50.

Figure 10A:
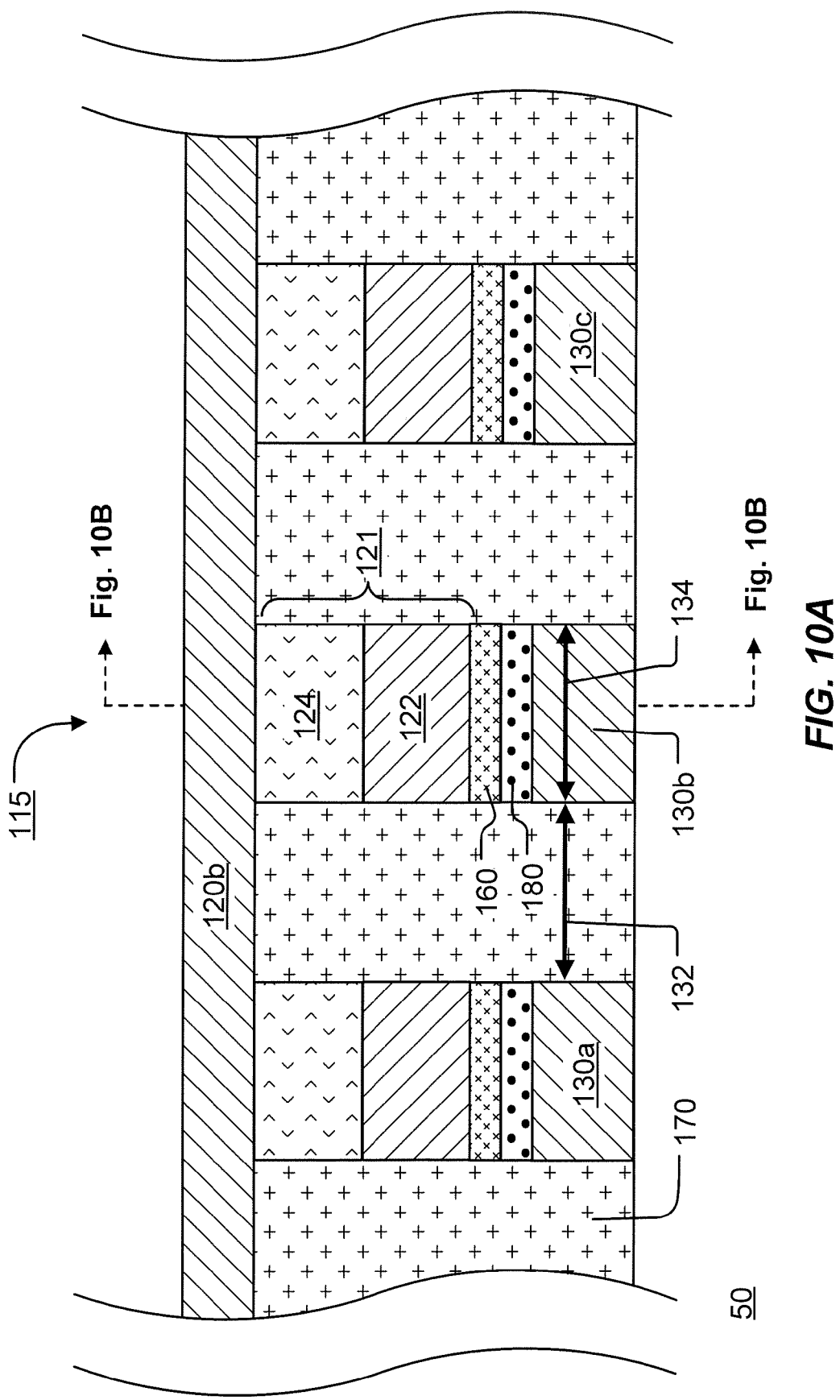
FIGS. 10A-10B illustrate cross-sectional views of a portion of a second embodiment of memory cells arranged in the array of FIG. 8.
Figure 10B:
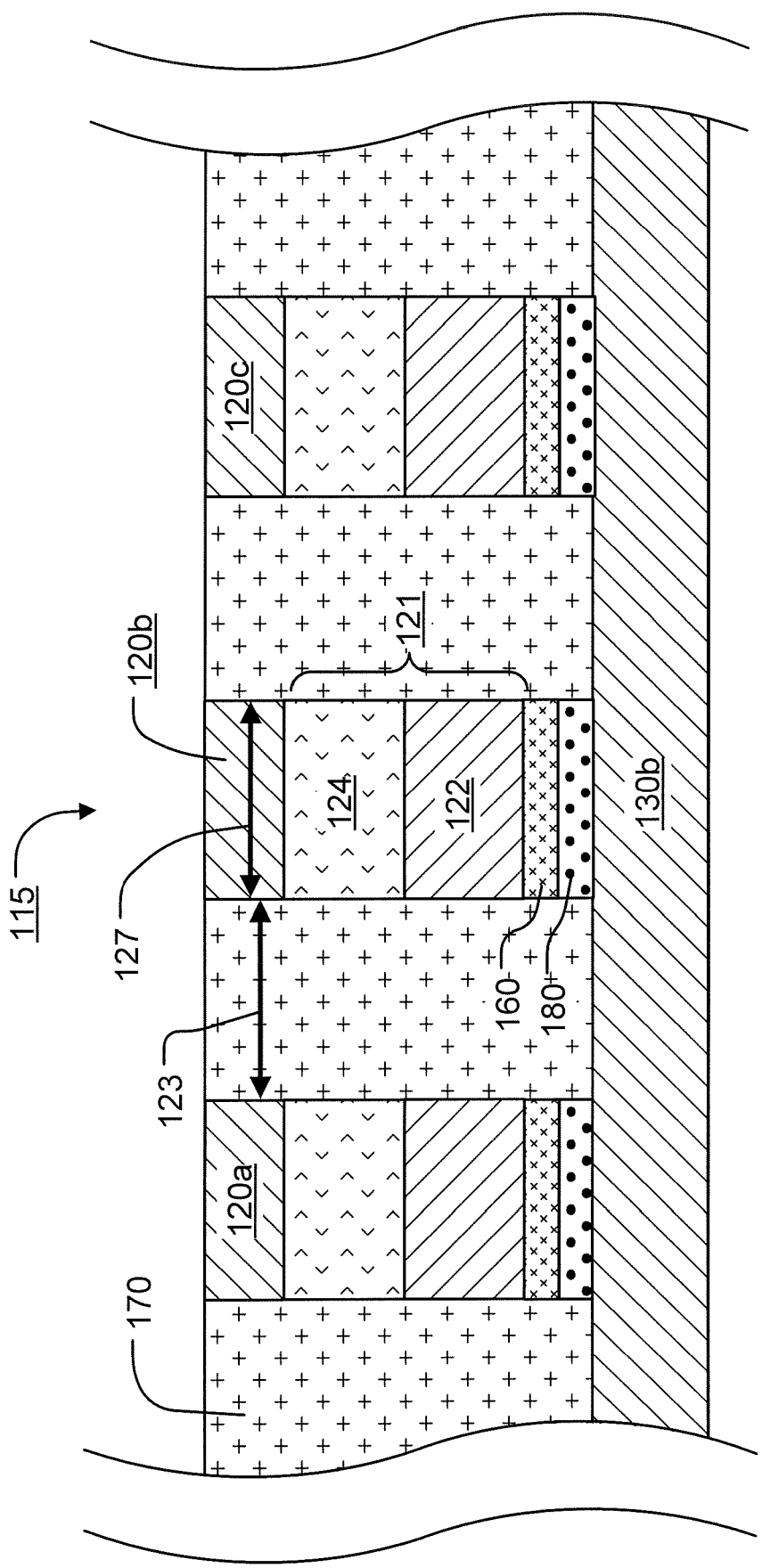

The word lines 130 have word line widths 134 and are separated from adjacent word lines 130 by a word line separation distance 1132 (See FIG. 9A), and the bit lines 120 have bit line widths 127 and are separated from adjacent bit lines 120 by a bit line separation distance 123 (See FIG. 9B). In embodiments the sum of the word line width 134 and the word line separation distance 132 is equal to twice a feature size F of a process used to form the array 50, and the sum of the bit line width 127 and the bit line separation distance 123 is equal to twice the feature size F. Additionally, F is preferably a minimum feature size for a process (typically a lithographic process) used to form the bit lines 120 and word lines 130, such that the memory cells of array 100 have a memory cell area of $4F^2$ FIGS. 10A and 10B illustrate cross-sectional views of a portion of a second embodiment of memory cells (including representative memory cell 115) arranged in the cross-point array 50, FIG. 10A taken along the bit lines 120 and FIG. 9B taken along the word lines 130. The embodiment of FIGS. 10A-10B is like that of FIGS. 9A-9B, and has the diode 121 overlying the memory element 160.

The anti-fuse metal-oxide memory elements described herein comprising aluminum and copper can also be implemented in 3-D stackable memory to further increase the memory array density. For example, the structures of FIGS. 9A-9B or 10A-10B may be repeated vertically with the bit lines of an underlying layer acting as the word lines of an overlying layer.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
   a first electrode;
   a second electrode;
   a diode; and
   an anti-fuse metal-oxide memory element comprising aluminum oxide and copper oxide, the diode and the metal-oxide memory element arranged in electrical series between the first electrode and the second electrode.

2. The device of claim 1, wherein the diode and the metal-oxide memory element are arranged along a current path between the first electrode and the second electrode.

3. The device of claim 1, wherein the diode overlies the metal-oxide memory element.

4. The device of claim 3, wherein the diode is on the metal-oxide memory element.

5. The device of claim 1, wherein the metal-oxide memory element overlies the diode.

6. The device of claim 5, further comprising a conductive element underlying the metal-oxide memory element and electrically coupling the metal-oxide memory element to the diode.

7. The device of claim 6, wherein the conductive element comprises titanium nitride.

8. The device of claim 1, wherein the metal-oxide memory element further comprises at least one of the following: tungsten oxide, nickel oxide, cobalt oxide, and magnesium oxide.

9. The device of claim 1, wherein the diode comprises a pn junction diode.

10. The device of claim 1, wherein the diode comprises a Schottky diode.

11. A memory device comprising:
    a plurality of word lines;
    a plurality of bit lines; and
    a plurality of memory cells located between the word lines and bit lines, each of the memory cells in the plurality of memory cells comprising
      a diode; and
      an anti-fuse metal-oxide memory element comprising aluminum oxide and copper oxide, the diode and the metal-oxide memory element arranged in electrical series between a corresponding word line in the plurality of word lines and a corresponding bit line in the plurality of bit lines.

12. The device of claim 11, wherein the diode of the memory cells in the plurality of memory cells and the corresponding metal-oxide memory element are arranged along a current path between the corresponding word line and the corresponding bit line.

13. The device of claim 11, wherein the diode of the memory cells in the plurality of memory cells overlies the corresponding metal-oxide memory element.

14. The device of claim 11, wherein the metal-oxide memory element of the memory cells in the plurality of memory cells overlies the corresponding diode.

15. The device of claim 11, wherein:
    the bit lines overly the word lines and cross over the word lines at cross-point locations; and
    the plurality of memory cells are arranged at the cross-point locations.

16. The device of claim 11, wherein:
    the word lines have word line widths and adjacent word lines are separated by a word line separation distance;
    the bit lines have bit line widths and adjacent bit lines are separated by a bit line separation distance; and
    memory cells in the plurality of memory cells have a memory cell area, the memory cell area having a first side along a first direction and a second side along a second direction, the first side having a length equal to the sum of the bit line width and the bit line separation distance, the second side having a length equal to the sum of the word line width and the word line separation distance.

17. The device of claim 16, wherein the length of the first side is equal to twice a feature size F, and the length of the second side is equal to twice the feature size F, such that the memory cell area is equal to $4F^2$.

18. A method for manufacturing a memory device, the method comprising:
- forming a first electrode;
- forming a diode;
- forming an anti-fuse metal-oxide memory element comprising aluminum oxide and copper oxide; and
- forming a second electrode, the diode and the metal-oxide memory element arranged in electrical series between the first electrode and the second electrode.

19. The method of claim 18, wherein the diode and the metal-oxide memory element are arranged along a current path between the first electrode and the second electrode.

20. The method of claim 18, wherein the steps of forming the diode and forming the metal-oxide memory element comprise:
- forming the metal-oxide memory element; and
- forming the diode overlying the metal-oxide memory element.

21. The method of claim 18, wherein the steps of forming the diode and forming the metal-oxide memory element comprise:
- forming the diode; and
- forming the metal-oxide memory element overlying the diode.

* * * * *